United States Patent
Lee et al.

(10) Patent No.: US 7,289,387 B2
(45) Date of Patent: Oct. 30, 2007

(54) WORDLINE DECODER OF NON-VOLATILE MEMORY DEVICE USING HPMOS

(75) Inventors: Ho-Kil Lee, Gyeonggi-do (KR); Jin-Yub Lee, Seoul (KR)

(73) Assignee: Samsung Electronics Co., Ltd., Suown-si, Gyeonggi-do (KR)

( * ) Notice: Subject to any disclaimer, the term of this patent is extended or adjusted under 35 U.S.C. 154(b) by 0 days.

(21) Appl. No.: 11/383,064

(22) Filed: May 12, 2006

(65) Prior Publication Data

US 2007/0014184 A1    Jan. 18, 2007

(30) Foreign Application Priority Data

Jul. 14, 2005    (KR)    ...................... 10-2005-0063763

(51) Int. Cl.
*G11C 8/00* (2006.01)
(52) U.S. Cl. ........................ 365/230.06; 365/230.08; 365/189.05
(58) Field of Classification Search ........... 365/230.06, 365/230.08, 189.05
See application file for complete search history.

(56) References Cited

U.S. PATENT DOCUMENTS

| | | | |
|---|---|---|---|
| 5,949,735 A | * | 9/1999 | Jeong ..................... 365/230.06 |
| 6,411,554 B1 | | 6/2002 | Kawai |
| 6,587,375 B2 | | 7/2003 | Chung et al. |

* cited by examiner

*Primary Examiner*—David Lam
(74) *Attorney, Agent, or Firm*—Marger Johnson & McCollom, P.C.

(57) ABSTRACT

A wordline decoder for a non-volatile memory device includes a first inverter to invert a block selection signal into a first inverted result on a first node, a second inverter to invert the signal on the first node into a second inverted result on a second node, a first and a second transistor, each coupled to a power supply, coupled in series between the second node and a third node, a third transistor coupled between the third node and a fourth node having a gate coupled to the third node, a fourth transistor coupled between a high voltage supply and a fifth node having a source coupled to the high voltage supply and a gate coupled to the third node, and a fifth transistor coupled between the fifth node and the third node having a gate coupled to the first node.

19 Claims, 4 Drawing Sheets

WORDLINE DECODER OF NON-VOLATILE MEMORY DEVICE USING HPMOS

CROSS-REFERENCE TO RELATED PATENT APPLICATION

This application claims the benefit of Korean Patent Application No. 10-2005-0063763, filed on Jul. 14, 2005, in the Korean Intellectual Property Office, the disclosure of which is incorporated herein in its entirety by reference.

BACKGROUND OF THE INVENTION

1. Field of the Invention

This disclosure relates to a non-volatile semiconductor memory device, and more particularly, to a wordline decoder of a non-volatile semiconductor memory device.

2. Description of the Related Art

In general, semiconductor memory devices are divided into volatile semiconductor memory devices and non-volatile semiconductor memory devices. Volatile semiconductor memory devices are divided into dynamic random access memory (DRAM) devices and static random access memory (SRAM) devices. Volatile semiconductor memory devices can perform a read or write operation at a high speed but may lose all data stored in memory cells when an external power supply is turned off. Non-volatile semiconductor memory devices are divided into mask read only memory (MROM) devices, programmable read only memory (PROM) devices, erasable programmable read only memory (EPROM) devices, and electrically erasable programmable read only memory (EEPROM) devices.

Non-volatile semiconductor memory devices can permanently store data in memory cells regardless of whether an external power supply is turned off. As a result, non-volatile semiconductor memory devices are generally used for preserving data independent of a power interruption. However, it is not easy for ordinary users to erase data from or reprogram MROMs, PROMs and EPROMs. EEPROMs are electrically erasable or writable and thus are increasingly used for system program storage devices or auxiliary storage devices for storing data that may need to be updated often.

Flash memory devices, which are one type of EEPROM devices, are programmed by injecting hot electrons from a channel adjacent to a drain region into a floating gate. Specifically, when programming a flash memory device, a source region and a substrate region are grounded, a high voltage of about 9 V is applied to a control gate while a sufficient voltage to generate hot electrons, e.g., a voltage of about 5 V, is applied to a drain region. The threshold voltage of a memory cell programmed in the above-described manner increases because of negative electrons accumulating in a floating gate. When erasing data from a flash memory device, a negative voltage of about −9 V is applied to a control gate, and a voltage of about 9 V is applied to a bulk region so that negative electrons accumulated in a floating gate can be discharged to the bulk region. This effect may be referred to as Fouler-Nordheim Tunneling. Therefore, the threshold voltage of a memory cell erased in the above-described manner becomes lower than before. Programmed memory cells are referred to as off-cells, and erased memory cells are referred to as on-cells.

When reading data from a flash memory device, a voltage of about 1 V is applied to a drain region, and a voltage of 0 V is applied to a source region. A voltage (hereinafter referred to as a read voltage) which is between the threshold voltage of programmed memory cells and the threshold voltage of erased memory cells must be applied to a wordline connected to the memory cell to be read.

NAND-type flash memory devices have a structure in which a memory cell array includes memory strings. Each memory string is formed of multiple memory cells coupled in series, and is itself coupled in series between a bitline and a source line.

FIG. 1 is a circuit diagram of a conventional flash memory device 100. Referring to FIG. 1, the flash memory device 100 includes a block memory cell array 110 and a wordline decoding unit 120. The flash memory device 100 may include multiple block memory cell arrays and respective wordline decoders. For the convenience of description, the flash memory device 100 is illustrated in FIG. 1 with only one block memory cell array 110 and a wordline decoding unit 120 corresponding to the block memory cell array 110.

The block memory cell array 110 includes memory strings CS connected to corresponding bitlines (BL0, BL1, ..., $BL_{n-1}$). The memory strings CS are connected to a common source line CSL. Memory cells M0 through M15 of each of the memory strings CS are connected to respective corresponding wordlines WL0 through WL15. The gates string selection transistors SST which connect the memory strings CS to the bitlines BL0 through $BL_{n-1}$ are connected to a string selection line SSL. The gates of ground selection transistors GST which connect the memory strings CS to the common source line CSL are connected to a ground selection line GSL.

The wordline decoding unit 120 selectively activates the string selection line SSL, the ground selection line GSL, and the wordlines WL0 through WL15. The wordline decoding unit 120 includes a decoder 122 which receives address signals ADDR and generates a block wordline driving signal BLKWL, wordline driving signals S0 through S15, a string selection voltage VSSL, and a ground selection voltage VGSL. The wordline decoding unit 120 also includes a wordline driver 124 which transmits the wordline driving signals S0 through S15, the string selection voltage VSSL, and the ground selection voltage VGSL to the wordlines WL0 through WL15, the string selection line SSL, and the ground selection line GSL, respectively.

The decoder 122 decodes the address signals ADDR and provides a driving voltage to the string selection line SSL, the wordlines WL0 through WL15, and the ground selection line GSL in a program operation, an erase operation, or a read operation. The driving voltage provided by the decoder 122 may be a program voltage $V_{pgm}$ for a program operation, an erase voltage $V_{erase}$ for an erase operation, or a read voltage $V_{read}$ for a read operation. In addition, the decoder 122 provides a high voltage VPP to the block wordline driving signal BLKWL.

The wordline driver 124 includes a plurality of high-voltage path transistors SN, WN0 through WN15, GN, and CN. The gates of the high-voltage path transistors SN, WN0 through WN15, GN, and CN are connected to one another and to the block wordline driving signal BLKWL.

In general, the decoder 122 uses a high-voltage N-type MOS (HVNMOS) transistor. An HVNMOS transistor has a higher breakdown voltage, e.g., a breakdown voltage of 25-30 V, than typical N-type MOS transistors having a breakdown voltage of 5-6 V. However, a decoder using HVNMOS transistors requires a considerable number of control signals for applying a voltage to a wordline, and thus, it is difficult to control a decoder using a HVNMOS transistor.

In order to solve the problems with a decoder using a HVNMOS transistor, a method to design a decoder 122 using HPMOS has been developed.

FIG. 2 is a detailed circuit diagram of a decoder 122 using HPMOS, which generates a block wordline driving signal BLKWL. Referring to FIG. 2, the decoder 122 provides a high voltage VPP to the block wordline driving signal BLKWL in response to a block selection signal BLKi. The block selection signal BLKi is generated by decoding input address signals ADDR and is used for selecting a block memory cell array 110.

The block selection signal BLKi is input to a first inverter 201. An output of the first inverter 201 is input to a second inverter 202. An output of the second inverter 202 passes through an NMOS transistor 203 and a first depletion transistor 204 and then is output as the block wordline driving signal BLKWL. The gates of the NMOS transistor 203 and the first depletion transistor 204 are connected to a power supply voltage VDD. The first and second inverters are driven at the power supply voltage VDD.

The decoder 122 includes a second depletion transistor 205 and a PMOS transistor 206 coupled in series between the high voltage VPP and the block wordline driving signal BLKWL. The gate of the second depletion transistor 205 is connected to the block wordline driving signal BLKWL, and the gate of the PMOS transistor 206 is connected to the output of the first inverter 201.

When the level of the power supply voltage VDD decreases to 1.8 V, the decoder 122 generates an undesired current path A increasing the power consumption of a wordline decoder.

It is assumed that the first and second depletion transistors 204 and 205 have a threshold voltage Vth of about −2.2V and the high voltage VPP is between the range of 20V and 25V. Then, when the block selection signal BLKi is logic low, the output of the first inverter 201 is logic high, and the output of the second inverter 202 is logic low. Thus, a block wordline driving signal BLKWL having a logic low level is output via the NMOS transistor 203 and the first depletion transistor 204.

Here, the PMOS transistor 206 should be turned off due to the logic-high output of the first inverter 201. However, since the level of the power supply voltage VDD has decreased, the voltage of a high level on the output of the first inverter 201 has decreased. As a result, the PMOS transistor 206 is turned on.

When the level of the power supply voltage VDD is low and a block wordline driving signal BLKWL having the level of a ground is generated, a direct current (DC) path A passing through the second depletion transistor 205, the PMOS transistor 206, the first depletion transistor 204, the NMOS transistor 203, and an NMOS transistor (not shown) of the second inverter 202 is generated between the high voltage VPP and the ground. Due to the DC path A, the power consumption of a wordline decoder increases.

Therefore, in order to reduce the power consumption of the decoder 122, it is necessary to develop a wordline decoder capable of preventing an undesired current path from being generated even at lower power supply voltage levels.

SUMMARY OF THE INVENTION

An embodiment includes a wordline decoder for a non-volatile memory device including a first inverter to receive a block selection signal, invert the block selection signal into a first inverted result, and output the first inverted result to a first node, a second inverter to receive a signal on the first node, invert the signal on the first node into a second inverted result, and output the second inverted result to a second node, a first and a second transistor, each transistor having a gate coupled to a power supply, the first and second transistors coupled in series between the second node and a third node, and to transmit a signal on the second node to the third node, a third transistor coupled between the third node and a fourth node and having a gate coupled to the third node, a fourth transistor coupled between a high voltage supply and a fifth node, and having a source coupled to the high voltage supply and a gate coupled to the third node, and a fifth transistor coupled between the fifth node and the third node, and having a gate coupled to the first node.

BRIEF DESCRIPTION OF THE DRAWINGS

The above and other features and advantages of the invention will become more apparent by describing in detail exemplary embodiments thereof with reference to the attached drawings in which.

DETAILED DESCRIPTION OF THE INVENTION

Figure 1:
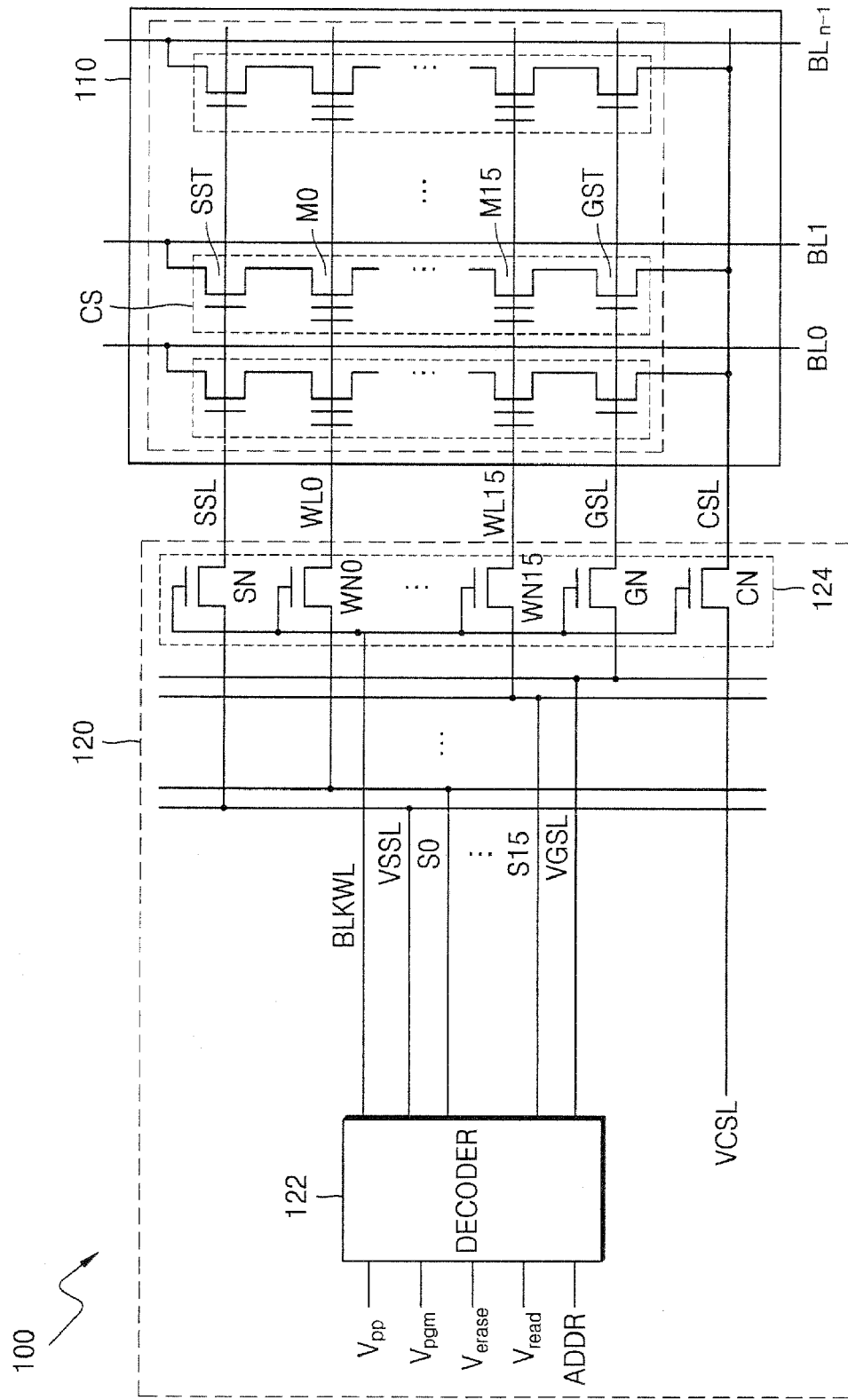
FIG. 1 is a circuit diagram of a conventional flash memory device.

Embodiments will now be described more fully with reference to the accompanying drawings. In the drawings, like reference numerals represent like elements.

Figure 3:
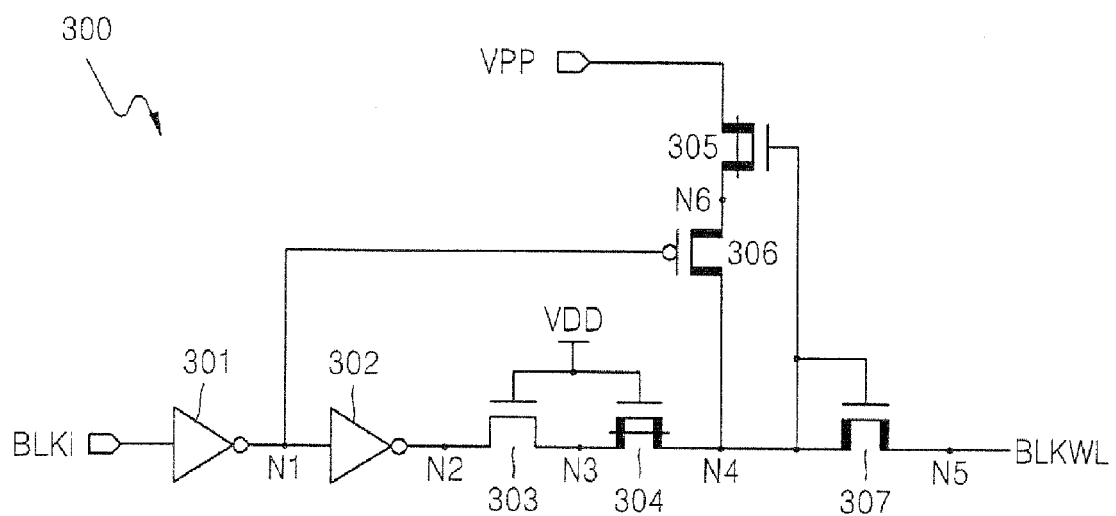
FIG. 3 is a detailed circuit diagram of a decoder using HPMOS according to an embodiment, which generates a block wordline driving signal.

FIG. 3 is a detailed circuit diagram of a decoder 300 using HPMOS that generates a block wordline driving signal BLKWL according to an embodiment. Referring to FIG. 3, the decoder 300 may be included in the wordline decoder 120 of FIG. 1. The decoder 300 includes a first inverter 301 to receive a block selection signal BLKi, invert the block selection signal BLKi, and output the inversion result to a first node N1, a second inverter 302 to receive a signal on of the first node N1, invert the signal on the first node N1, and output the inversion result to a second node N2, an NMOS transistor 303 and a first depletion transistor 304 coupled between the second node N2 and a third node N4 in series and having gates coupled to a power supply voltage VDD; an HVNMOS transistor 307 coupled between the third node N4 and a fourth node N5 and having a gate coupled to the third node N4; a second depletion transistor 305 coupled between a high voltage VPP and a fifth node N6 and having a gate coupled to the third node N4; and an HPMOS transistor 306 coupled between the fifth node N6 and the third node N4 and having a gate coupled to the first node N1. A signal on the fourth node N5 is the block wordline driving signal BLKWL.

Figure 2:
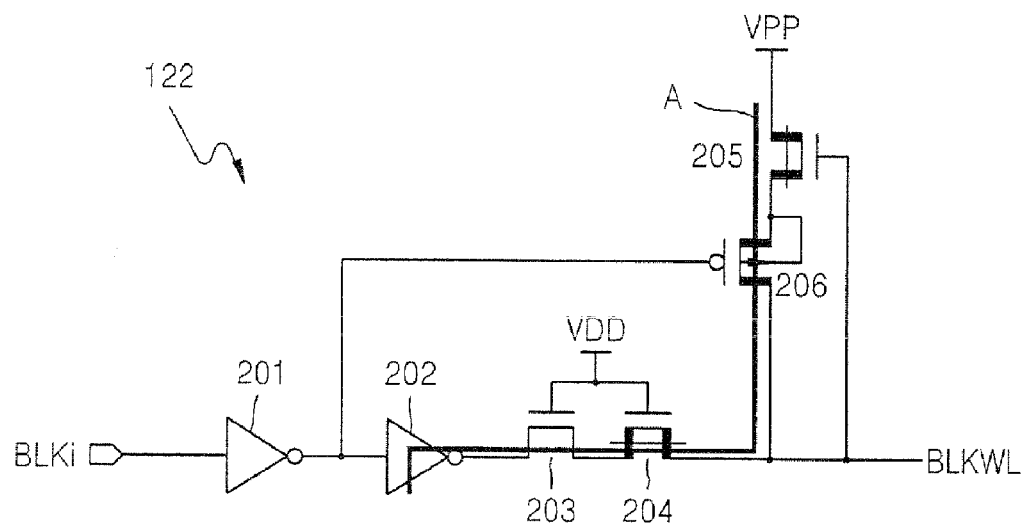
FIG. 2 is a detailed circuit diagram of a decoder using HPMOS of FIG. 1, which generates a block wordline driving signal.

The level of the high voltage VPP input to the decoder 300 is set lower than the level of the high voltage VPP input to the decoder 122 of FIG. 2. For example, if the high voltage VPP of FIG. 2 is 25V, the high voltage VPP of FIG. 3 may be 20V. In addition, the magnitude of the threshold voltage of the second depletion transistor 305 is set lower than the power supply voltage of the wordline decoder 300. For example, the threshold voltage of the second depletion transistor 305 may be set to −1.0V with a power supply voltage of 1.8V. Thus, the magnitude of the threshold voltage of the second depletion transistor of 1.0V is less than the power supply voltage of 1.8V.

The operation of the decoder 300 will now be described in detail.

If a block selection signal BLKi is a logic low, the decoder 300 generates a block wordline signal BLKWL having a logic low level in response. Since an output of the third node N4 is logic low and the second depletion transistor 305 has a threshold voltage of about −1.0V, the second depletion transistor 305 is slightly turned on. Accordingly, the voltage at the fifth node N6 becomes 1.0V. If the power supply voltage VDD is 3.3V, a high level signal on the first node N1 is high enough to turn off the HPMOS transistor 306. As a result, a DC path from VPP to ground through the decoder 300 is prevented.

If the power supply voltage VDD is 1.8V, a high level signal on the first node N1 is still high enough to turn off the HPMOS transistor 306. The threshold voltage of the second depletion transistor 305 is set to −1.0V, causing the fifth node N6 to be pulled to 1.0V. As a result, the gate-source voltage of the HPMOS transistor 306 is 0.8V. Since the HPMOS transistor 306 is turned on with a gate-source voltage less then 0V, the HPMOS transistor 306 is not turned on. Thus, an undesired DC path from VPP to the ground is not formed in the decoder 300.

Therefore, when used in a flash memory device in a mobile terminal having a power supply voltage of 1.8 V or lower, an undesired DC path is not formed in the decoder 300, reducing the power consumption of the flash memory device, and preventing the flash memory device from malfunctioning due to the reduction in the level of the high voltage VPP due to the leakage current.

If the block selection signal BLKi is a logic high, the voltage at the first node N1 becomes a logic low, and the HPMOS transistor 306 is turned on. Accordingly, the voltage at the third node N4 becomes logic high, turning on the second depletion transistor 305. As a result, the voltage at the third node N4 increases to a level as high as the high voltage VPP (e.g., 20V), and the voltage at the fourth node N5 increases to 15V. Since the HVNMOS transistor 307 serves as a diode, the fourth node N5 is in a floating state. When the fourth node N5 increases to 15V, the voltage at the fourth node N5 is self-boosted according to a voltage applied to the source of the HVNMOS transistor of the wordline driver 124 of FIG. 1. In other words, the fourth node N5 is in a floating state, and thus, as the capacitance of a channel formed in HVNMOS transistors to the gates of which the block wordline signal BLKWL is applied increases, the voltage at the fourth node N5 is gradually boosted to 20V.

Figure 4:
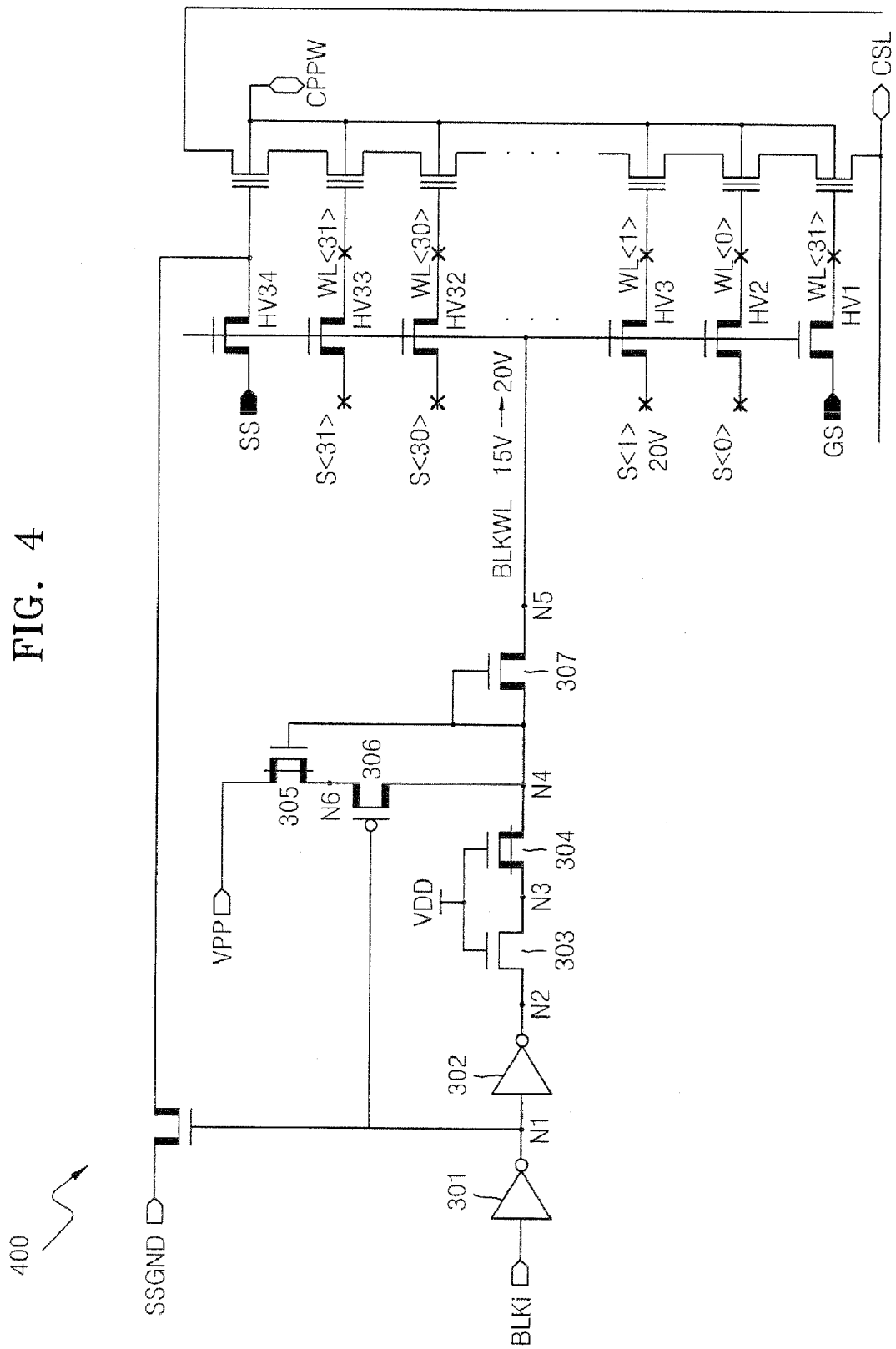
FIG. 4 is a circuit diagram of a wordline driving unit and memory cells which are connected to the decoder of FIG. 3.
Figure 5:
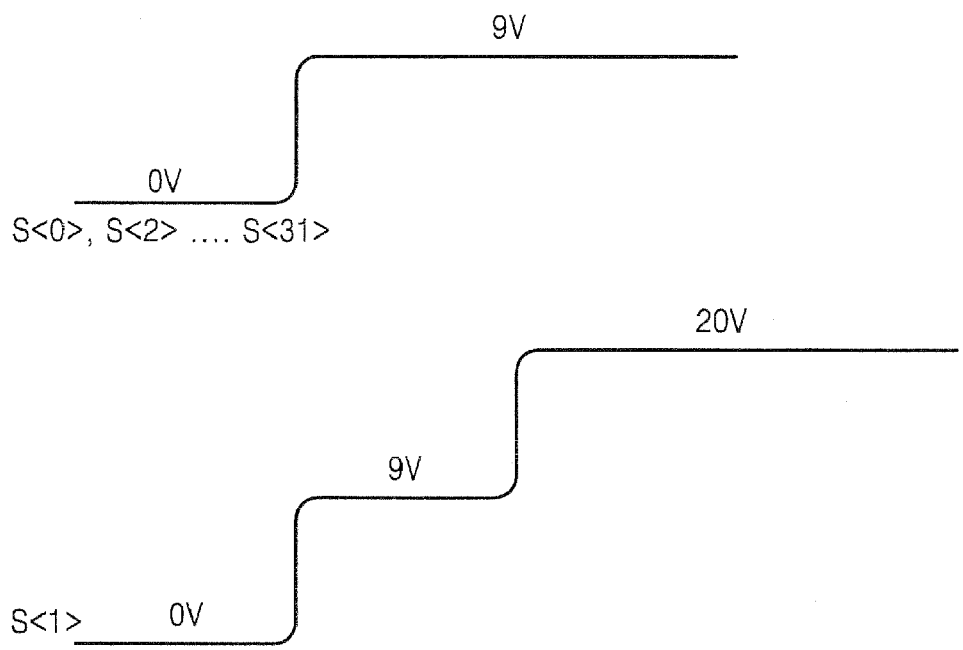
FIG. 5 is a diagram illustrating the variation in the voltage of a chosen wordline and the variation in the voltage of a not-chosen wordline.

FIG. 4 is a circuit diagram of a wordline driving unit and memory cells which are coupled to the decoder 300 of FIG. 3, and FIG. 5 is a diagram illustrating the variation in the voltage of a chosen wordline and the variation in the voltage of a not-chosen wordline. Referring to FIGS. 4 and 5, assuming that a wordline WL<1> is chosen, a voltage of 20V is applied to an HVNMOS transistor HV3 coupled to a selection signal S<1> and a voltage of 9V is applied to HVNMOS transistors HV2 and HV4 through HV33 coupled to selection signals S<0> and S<2> through S<31>, respectively. Then, a block wordline driving signal BLKWL having a voltage of 15V is applied to the gate of the HVNMOS transistor HV3. Accordingly, a channel is formed in the HVNMOS transistor HV3. Thus, the voltage at the gate of the HVNMOS transistor HV3 increases according to the voltage at the source of the HVNMOS transistor HV3. Accordingly, the voltage at the fourth node N5 is self-boosted to 20V.

In the decoder 122 of FIG. 2, the block wordline driving signal BLKWL can be boosted to a voltage of 20V only when increasing the level of the high voltage VPP to 22V-25V. However, by using the decoder 300, even when the level of the high voltage VPP decreases to 20V, it is possible to provide a high driving voltage to the block wordline driving signal BLKWL through a self-boosting operation.

Figure 6:
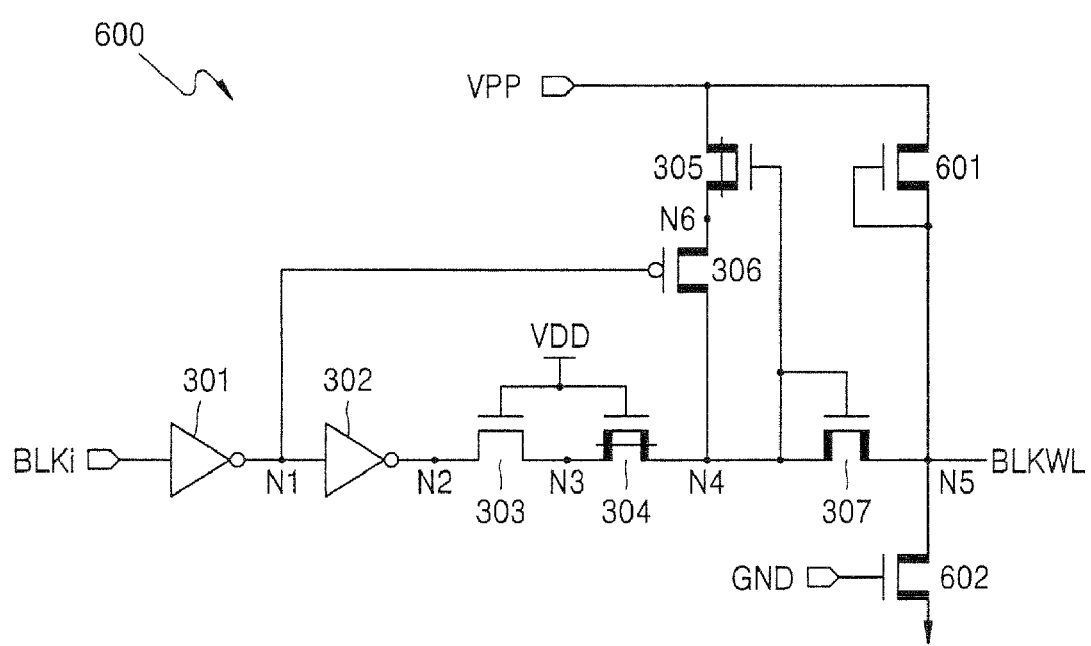
FIG. 6 is a detailed circuit diagram of a decoder according to another embodiment.

FIG. 6 is a detailed circuit diagram of a decoder 600 according to another embodiment. Referring to FIG. 6, the decoder 600 is the same as the decoder 300 of FIG. 3 except that the decoder 600 includes second and third HVNMOS transistors 601 and 602.

The second HVNMOS transistor 601 is coupled between a high voltage VPP and a fourth node N5, and the gate of the second HVNMOS transistor 601 is coupled to the fourth node N5. Thus, the second HVNMOS transistor 601 can serve as a diode. The third HVNMOS transistor 602 is coupled between the fourth node N5 and a ground, and the gate of the third HVNMOS transistor 602 is coupled to a ground selection signal GND.

The second HVNMOS transistor 601 serves as a diode preventing the fourth node N5 from being self-boosted too high. In other words, if the level of the voltage at the fourth node N5 is lower than the level of the high voltage VPP, the second HVNMOS transistor 601 is turned off. However, if the level of the voltage at the fourth node N5 is not lower than the level of the high voltage VPP, the second HVNMOS transistor 601 is turned on and thus discharges the fourth node N5 to the high voltage VPP, thereby preventing excessive self-boosting of the fourth node N5.

When the level at the fourth node N5 is logic low because no block wordline is chosen, the third HVNMOS transistor 602 discharges the fourth node N5 to the ground in response to the ground selection signal GND.

The first inverter 301 of FIG. 3, 4, or 6 may include a NAND gate if multiple block selection signals BLKi are used.

As described above, it is possible to prevent a leakage current even when a non-volatile memory device has a low power supply voltage and no wordline is chosen. Therefore, it is possible to reduce the power consumption of the non-volatile memory device and prevent the non-volatile memory device from malfunctioning due to a reduction in the level of a high voltage du to the leakage current.

In addition, it is possible to obtain a higher voltage than in the prior art by applying a high voltage whose level is as high as the level of an actual block wordline driving voltage.

Moreover, it is possible to prevent a waste of energy by reducing the level of the high voltage.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. A wordline decoder for a non-volatile memory device comprising:
   a first inverter to receive a block selection signal, invert the block selection signal into a first inverted result, and output the first inverted result to a first node;
   a second inverter to receive a signal on the first node, invert the signal on the first node into a second inverted result, and output the second inverted result to a second node;
   a first and a second transistor, each transistor having a gate coupled to a power supply, the first and second transistors coupled in series between the second node and a third node, and to transmit a signal on the second node to the third node;
   a third transistor coupled between the third node and a fourth node and having a gate coupled to the third node;
   a fourth transistor coupled between a high voltage supply and a fifth node, and having a source coupled to the high voltage supply and a gate coupled to the third node; and
   a fifth transistor coupled between the fifth node and the third node, and having a gate coupled to the first node.

2. The wordline decoder of claim 1, wherein one of the first and second transistors is a depletion NMOS transistor.

3. The wordline decoder of claim 2, wherein the other of the first and second transistors is an NMOS transistor.

4. The wordline decoder of claim 1, wherein the third transistor is an NMOS transistor.

5. The wordline decoder of claim 1, wherein the fourth transistor is a depletion NMOS transistor.

6. The wordline decoder of claim 5, wherein a magnitude of a threshold voltage of the fourth transistor is less than a voltage of the power supply.

7. The wordline decoder of claim 1, wherein the fifth transistor is a PMOS transistor.

8. The wordline decoder of claim 1, wherein a voltage level of the high voltage supply is set to be equal to a voltage for enabling the block wordline driving signal.

9. The wordline decoder of claim 1, further comprising a sixth transistor coupled between the high voltage supply and the fourth node, and having a gate coupled to the fourth node.

10. The wordline decoder of claim 1, further comprising a seventh transistor coupled between the fourth node and a ground, and having a gate to receive a ground selection signal.

11. A wordline decoder for a non-volatile memory device comprising:
   a first inverter to receive a block selection signal, invert the block selection signal into a first inverted result, and output the first inverted result to a first node;
   a second inverter to receive a signal on the first node, invert the signal on the first node into a second inverted result, and output the second inverted result to a second node;
   a first and a second transistor, each transistor having a gate coupled to a power supply, the first and second transistors coupled in series between the second node and a third node, and to transmit a signal on the second node to the third node;
   a third transistor coupled between the third node and a fourth node and having a gate coupled to the third node;
   a fourth transistor coupled between a high voltage supply and a fifth node, and having a source coupled to the high voltage supply and a gate coupled to the third node;
   a fifth transistor coupled between the fifth node and the third node, and having a gate coupled to the first node;
   a sixth transistor coupled between the high voltage supply and the fourth node, and having a gate coupled to the fourth node; and
   a seventh transistor coupled between the fourth node and a ground, and having a gate to receive a ground selection signal.

12. The wordline decoder of claim 11, wherein one of the first and second transistors is a depletion NMOS transistor.

13. The wordline decoder of claim 12, wherein the other of the first and second transistors is an NMOS transistor.

14. The wordline decoder of claim 11, wherein the third transistor is an NMOS transistor.

15. The wordline decoder of claim 11, wherein the fourth transistor is a depletion NMOS transistor.

16. The wordline decoder of claim 15, wherein a magnitude of a threshold voltage of the fourth transistor is less than a voltage of the power supply.

17. The wordline decoder of claim 11, wherein the fifth transistor is a PMOS transistor.

18. The wordline decoder of claim 11, wherein a voltage level of the high voltage supply is set to be equal to a voltage for enabling the block wordline driving signal.

19. The wordline decoder of claim 11, wherein the sixth and seventh transistors are NMOS transistors.

* * * * *